United States Patent
Kathrein et al.

(10) Patent No.: US 8,828,563 B2
(45) Date of Patent: Sep. 9, 2014

(54) CUTTING TOOL FOR MACHINING METALLIC MATERIALS

(75) Inventors: Martin Kathrein, Reutte (AT); Werner Bürgin, Sissach (CH); Christoph Czettl, Pöls (AT); Peter Lechleitner, Elmen (AT); Josef Thurner, Heiterwang (AT)

(73) Assignee: Ceratizit Austria Gesellschaft mbH, Reutte/Tirol (AT)

( * ) Notice: Subject to any disclaimer, the term of this patent is extended or adjusted under 35 U.S.C. 154(b) by 35 days.

(21) Appl. No.: 13/500,368

(22) PCT Filed: Sep. 2, 2010

(86) PCT No.: PCT/AT2010/000317
§ 371 (c)(1),
(2), (4) Date: Jun. 7, 2012

(87) PCT Pub. No.: WO2011/041804
PCT Pub. Date: Apr. 14, 2011

(65) Prior Publication Data
US 2012/0243951 A1 Sep. 27, 2012

(30) Foreign Application Priority Data
Oct. 5, 2009 (AT) ................. GM614/2009

(51) Int. Cl.
| | |
|---|---|
| *B32B 9/00* | (2006.01) |
| *B32B 15/04* | (2006.01) |
| *B23B 3/02* | (2006.01) |
| *C23C 30/00* | (2006.01) |
| *C23C 16/40* | (2006.01) |
| *C23C 16/36* | (2006.01) |

(52) U.S. Cl.
CPC ............. *C23C 16/36* (2013.01); *C23C 30/005* (2013.01); *C23C 16/403* (2013.01)
USPC ........... 428/698; 428/627; 428/701; 428/702; 51/309

(58) Field of Classification Search
None
See application file for complete search history.

(56) References Cited

U.S. PATENT DOCUMENTS 4,599,281 A * 7/1986 Schintlmeister et al. ...... 428/699
4,746,563 A 5/1988 Nakano et al.
(Continued)

FOREIGN PATENT DOCUMENTS

CN 1620349 A 5/2005
EP 0 162 656 A2 11/1985
(Continued)

OTHER PUBLICATIONS

Barbatti et al. "Influence of micro-blasting on the microstructure and residual stresses of CVD kappa-Al2O3 coatings", Jun. 17, 2009, Surface & Coatings Technology, vol. 203, pp. 3708-3717.*

(Continued)

*Primary Examiner* — Gwendolyn Blackwell
*Assistant Examiner* — Seth Dumbris
(74) *Attorney, Agent, or Firm* — Laurence A. Greenberg; Werner H. Stemer; Ralph E. Locher

(57) ABSTRACT

A cutting tool for metal material processing has a hard metal body and a multi-layer coating applied to the hard metal body in at least one surface area. The multi-layer coating includes the following, sequentially in direction from the hard metal body to the surface of the cutting tool: at least one layer $TiC_{x1}N_{y1}$, where $x1+y1=1$, $x1\geq 0$, $y1>0$; at least one layer $TiC_{x2}N_{y2}O_{z2}$, where $x2+y2+z2=1$, $0\leq z2\leq 0.03$ and $0.5\leq x2\leq 0.85$; at least one layer TiN, or $TiC_{x31}N_{y31}$, where $0.2\leq x31\leq 0.8$ and $x31+y31=1$, or $TiN_{y32}B_{v32}$, where $0.0001\leq v32\leq 0.05$ and $y32+v32=1$; at least one layer: $TiN_{y41}B_{v41}O_{z41}$, where $y41+v41+z41=1$ and $0.0001\leq v41\leq 0.05$ and $0.01\leq z41\leq 0.6$, or $TiC_{x42}N_{y42}O_{z42}$, where $x42+y42+z42=1$ and $0\leq y42\leq 0.5$ and $0.01\leq z42\leq 0.6$; and at least one outer layer $\kappa$-$Al_2O_3$. The at least one layer $TiC_{x2}N_{y2}O_{z2}$ has a texture in the direction having a texture coefficient $TC_{(311)}=1.3$.

14 Claims, 2 Drawing Sheets

(56) References Cited

U.S. PATENT DOCUMENTS

| | | | |
|---|---|---|---|
| 4,812,370 A | 3/1989 | Okada et al. | |
| 5,372,873 A | 12/1994 | Yoshimura et al. | |
| 5,576,093 A | 11/1996 | Yoshimura et al. | |
| 5,705,263 A * | 1/1998 | Lenander et al. | 428/216 |
| 5,786,069 A | 7/1998 | Ljungberg et al. | |
| 5,920,760 A | 7/1999 | Yoshimura et al. | |
| 6,093,479 A | 7/2000 | Yoshimura et al. | |
| 6,293,739 B1 * | 9/2001 | Uchino et al. | 407/119 |
| 6,344,264 B1 | 2/2002 | Lenander et al. | |
| 6,344,265 B1 * | 2/2002 | Blomstedt et al. | 428/216 |
| 7,087,295 B2 | 8/2006 | Okada et al. | |
| 7,192,660 B2 * | 3/2007 | Ruppi | 428/698 |
| 7,655,293 B2 | 2/2010 | Ljungberg | |
| 2004/0180241 A1 * | 9/2004 | Rodmar et al. | 428/698 |
| 2005/0042482 A1 | 2/2005 | Okada et al. | |
| 2008/0160338 A1 * | 7/2008 | Tanibuchi et al. | 428/627 |
| 2009/0214857 A1 * | 8/2009 | Itoh et al. | 428/336 |
| 2010/0232893 A1 | 9/2010 | Imamura et al. | |

FOREIGN PATENT DOCUMENTS

| | | | |
|---|---|---|---|
| EP | 0 263 747 A1 | 4/1988 | |
| EP | 0 594 875 A1 | 5/1994 | |
| EP | 0 685 572 A2 | 12/1995 | |
| EP | 1473101 * | 3/2004 | B23B 27/14 |
| EP | 1 473 101 A1 | 11/2004 | |
| EP | 1696051 A1 | 8/2006 | |
| JP | 6008010 A | 1/1994 | |
| JP | H11131235 A | 5/1999 | |
| JP | H11512033 A | 10/1999 | |
| JP | 2000158207 A | 6/2000 | |
| JP | 2000334608 A | 12/2000 | |
| JP | 2007210066 A | 8/2007 | |
| JP | 2009095907 A | 5/2009 | |

OTHER PUBLICATIONS

Austrian Patent Office Search Report, Dated Feb. 4, 2011.

Larsson, et al., "Microstructure and properties of Ti(C,N) coatings produced by moderate temperature chemical vapour deposition", Thin Solid Films, Jan. 2002, pp. 203-210, vol. 402, No. 1-2, Elsevier-Sequoia S.A. Lausanne, Switzerland.

Halvarsson, et al., "X-ray powder diffraction data for κ-Al2O3", Powder Diffraction, Mar. 1999, pp. 61-63, vol. 14, No. 1, AIP for JCPDS—International Centre for Diffraction Data, USA.

Barbatti, et al., "Influence of micro-blasting on the microstructure and residual stresses of CVD κ-Al2O3 coatings", Surface & Coatings Technology, Jun. 2009, pp. 3708-3717, vol. 203, No. 24, Elsevier Science S.A., Switzerland.

Pochet, et al., "CVD coatings: from cutting tools to aerospace applications and its future potential", Surface & Coatings Technology, Oct. 1997, pp. 70-75, vol. 94-95, No. 1-3, Elsevier Science S.A., Switzerland.

Czettl et al., "CO addition in low-pressure chemical vapour deposition of medium-temperature TiCxN1-x based hard coatings", Surface & Coatings Technology 206 (2011) pp. 1691-1697.

* cited by examiner

CUTTING TOOL FOR MACHINING METALLIC MATERIALS

BACKGROUND OF THE INVENTION

Field of the Invention

The present invention relates to a cutting tool for machining metallic materials. In particular, the invention relates to a cutting tool of this type comprising a hard metal body and a multilayer coating applied to the hard metal body in at least one surface region.

Cutting tools of this type are used in particular as indexable inserts for turning and for cutting processes similar to turning on iron-based materials, e.g. steels, cast materials and stainless steels. In this case, the cutting tools are used in particular for fine, medium and coarse machining operations. A distinction is made in this respect between fine, medium and coarse machining by dividing into regions of small chip cross sections (at high cutting speeds) up to large chip cross sections (at relatively low cutting speeds).

It is known to increase the service life by applying hard material layers with a high wear resistance to cutting tools which are subjected to wear and consist of wear-resistant hard metal by means of thermally activated chemical vapour deposition (CVD). In this case, the hard material layers are often applied as multilayer coatings with different chemical compositions. As multilayer coatings of this type, it is possible to use layers of $TiC_xN_yO_zB_v$ and $Al_2O_3$, where $x+y+z+v=1$.

The individual parameters x, y, z and v in this case can assume different values; in particular, one or more of the parameters in the individual layers can in some cases have the value 0. Using multilayer coatings of this type, it is possible to achieve surfaces having hardness values (determined to EN ISO 14577-1) in the range of 15 to 40 GPa. Since the surfaces produced by means of CVD processes usually have a (poly) crystalline structure, in many cases the (outermost) surface is smoothed, e.g. by pressurized-jet smoothing with a dry or wet jet usually comprising ceramic abrasive bodies.

It is known to use $Al_2O_3$ as the outer layer of cutting tools. In some cases, a thin layer of TiN, $TiC_xN_y$ (where $x+y=1$) or a combination of layers of this type is also deposited on said outer layer. $Al_2O_3$ can crystallize in a large number of different phases, two of these phases primarily playing a role in relation to the deposition of thin $Al_2O_3$ layers by means of CVD processes for hard material layers of cutting tools: $\alpha$-$Al_2O_3$ and $\kappa$-$Al_2O_3$. $\alpha$-$Al_2O_3$ is a thermodynamically stable hexagonal phase and $\kappa$-$Al_2O_3$ is a thermodynamically metastable phase. It is possible to deposit layers of (substantially) pure $\alpha$-$Al_2O_3$ or layers of (substantially) pure $\kappa$-$Al_2O_3$. However, it is also possible for layers which comprise a mixture of $\alpha$-$Al_2O_3$ and $\kappa$-$Al_2O_3$ to be formed, in which case different mixing ratios can be achieved. By suitably selecting the layers which are deposited directly underneath the $Al_2O_3$ layer (in particular the exact chemical composition thereof, morphology and the texture thereof), and also by suitably selecting the coating parameters in the CVD process for forming the $Al_2O_3$ layer, it is possible in modern CVD plants for either $\alpha$-$Al_2O_3$ or $\kappa$-$Al_2O_3$ to be reliably and purposefully deposited.

The multilayer coatings described are usually produced in the CVD process with thermal activation at temperatures above 500° C. The layers are therefore formed at high temperatures and, as this is then generally followed by cooling to room temperature. When machining metallic materials using the cutting tools, the temperatures in the multilayer coatings sometimes increase back up to high temperatures. Since the layers are produced at high temperatures and on account of the different coefficients of thermal expansion of the individual layers, tensile and compressive stresses form in the various layers on cooling to room temperature. These different stresses in the layers can have the effect that cracking occurs in the outer layers of the cutting tool on cooling to room temperature or during the material machining. This cracking and stress gradients which remain between the layers are directly related to the achievable service life of the cutting tool, since spalling of regions of one or more layers can occur in a promoted manner starting from the cracks which have formed and/or as a result of high remaining stress gradients. Particularly critical sites, at which it is possible for parts of one or more layers to become detached, are formed in particular by the interfaces between a layer and a next layer which immediately adjoins the latter.

In the case of the multilayer coatings described above, there are a large number of possibilities for combination in relation to the layer sequence, selection of the chemical composition of the individual layers, layer thicknesses and texturing of the individual layers. The production of a cutting tool which is intended to have particularly good properties, in particular a high service life, depends most notably on the precise sequence of the individual layers, the texture thereof and the tensile and compressive stresses which remain in the individual layers. It has been found that a change in the texture in a layer of the multilayer coatings in particular can have a considerable effect on the achieved quality of the cutting tool. The interaction between the precise layer sequence and smoothing of the (outermost) surface, e.g. by a pressurized-jet process, can have a considerable influence on the properties of the cutting tool which is formed. In this context, it has been found in particular that the use of a pressurized-jet process has a decisive impact on the achieved quality of the cutting tool, depending on the layer sequence in the multilayer coating and depending on the outermost layer to be smoothed.

In view of the thermal stability thereof, the use of $\alpha$-$Al_2O_3$ for hard material layers for coating tools is usually deemed advantageous compared to the use of $\kappa$-$Al_2O_3$.

EP 1 696 051 A1 describes a hard material coating for cutting tool inserts comprising a polycrystalline layer of 100% $\alpha$-$Al_2O_3$, which is formed on a $TiC_xN_y$ layer. The predefined layer sequence and in particular the use of the 100% $\alpha$-$Al_2O_3$ layer are said to have a positive effect on the stress conditions in the tool coating.

BRIEF SUMMARY OF THE INVENTION

It is an object of the present invention to provide a cutting tool for machining metallic materials, which comprises a hard metal body and a multilayer coating applied to the hard metal body in at least one surface region and which achieves improved properties and improved durability in various cutting conditions.

The object is achieved by a cutting tool according to claim 1. Advantageous developments are specified in the dependent claims. A cutting tool according to the invention for machining metallic materials comprises a hard metal body and a multilayer coating applied to the hard metal body in at least one surface region. The multilayer coating comprises the following in the following order in a direction from the hard metal body to the surface of the cutting tool: (i.) at least one layer $TiC_{x1}N_{y1}$ (where $x1+y1=1$, $x1 \geq 0$, $y1 \geq 0$); (ii.) at least one layer $TiC_{x2}N_{y2}O_{z2}$ (where $x2+y2+z2=1$, $0 \leq z2 \leq 0.03$ and $0.5 \leq x2 \leq 0.85$); (iii.) at least one layer TiN, or $TiC_{x31}N_{y31}$ (where $0.2 \leq x31 \leq 0.8$ and $x31+y31=1$), or $TiN_{y32}B_{v32}$ (where $0.0001 \leq v32 \leq 0.05$ and $y32+v32=1$); (iv.) at least one layer $TiN_{y41}B_{v41}O_{z41}$ (where $y41+v41+z41=1$ and $0.0001 \leq v41 \leq 0.05$ and $0.01 \leq z41 \leq 0.6$), or $TiC_{x42}N_{y42}O_{z42}$ (where $x42+y42+z42=1$ and $0 \leq y42 \leq 0.5$ and $0.01 \leq z42 \leq 0.6$); and (v.) at least one outer layer $\kappa\text{-}Al_2O_3$. The at least one layer $TiC_{x2}N_{y2}O_{z2}$ has a texturing in the (311) direction with a texture coefficient $TC_{(311)} \geq 1.3$. The layer mentioned under (iii.) therefore comprises TiN or $TiC_{x31}N_{y31}$ or $TiN_{y32}B_{v32}$. The layer mentioned under (iv.) comprises $TiN_{y41}B_{v41}O_{z41}$ or $TiC_{x42}N_{y42}O_{z42}$. In the case of the selected designations, the following should be taken into consideration: regarding the layer (i.) $TiC_{x1}N_{y1}$, $x1=0$ is also possible; in the case of the layer (ii.) $TiC_{x2}N_{y2}O_{z2}$, $z2=0$ is also possible; in the case of the layer (second alternative to iv.) $TiC_{x42}N_{y42}O_{z42}$, $y42=0$ is also possible. The at least one layer $TiC_{x1}N_{y1}$ preferably has a layer thickness of between 0.1 µm and 1 µm, in particular of between 0.1 µm and 0.8 µm. The at least one layer $TiC_{x2}N_{y2}O_{z2}$ preferably has a layer thickness of between 5 µm and 15 µm, in particular of between 8 µm and 14 µm. The at least one layer which can consist of TiN or $TiC_{x31}N_{y31}$ or $TiN_{y32}B_{v32}$ preferably has a layer thickness of between 0.1 µm and 3 µm. The at least one layer which can consist of $TiN_{y41}B_{v41}O_{z41}$ or $TiC_{x42}N_{y42}O_{z42}$ preferably has a layer thickness of between 0.01 µm and 0.5 µm. The at least one outer layer $\kappa\text{-}Al_2O_3$ preferably has a layer thickness of between 2 µm and 10 µm, in particular of between 3.5 µm and 6.5 µm.

It has been found that the stress conditions throughout the multilayer coating can be set particularly well with the specified layer sequence and in particular the combination of the outer layer $\kappa\text{-}Al_2O_3$ with the preferred texturing of the $TiC_{x2}N_{y2}O_{z2}$ layer in the (311) direction and the intermediate layers arranged therebetween. In particular, preferred stress conditions can be set after the layer deposition by a mechanical smoothing process, in particular by pressurized-jet smoothing. The specified layer sequence of the multilayer coating in this case ensures, inter alia, a particularly good and stable transition between the individual layers from the hard metal body as far as the outer layer, and the desired stress conditions in the individual layers can be set reliably. The features specified make it possible for a compressive stress which brings about a stable surface upon use of the cutting tool to be set in an outermost marginal region of the $\kappa\text{-}Al_2O_3$ layer, and for a transition to be effected to a tensile stress in the direction of the layers lying further inwards. In this context, a tensile stress denotes a stress which acts along the layer plane and acts in the direction of a reduction in the layer area. A compressive stress denotes a stress which acts along the layer plane and acts in the direction of an increase in the layer area. It has become apparent in particular that a particularly advantageous stress gradient can form in a direction from the surface to the hard metal body. On account of these features, improved properties and improved durability are achieved in various cutting conditions. The formation of the outer layer as a $\kappa\text{-}Al_2O_3$ layer makes it possible to positively affect the properties of the cutting tool, since $\kappa\text{-}Al_2O_3$ allows for a higher degree of plastic deformation compared to $\alpha\text{-}Al_2O_3$ in a mechanical smoothing process and compressive stresses can be set better at the surface. One or more further layers can also be formed on the surface of the at least one outer layer $\kappa\text{-}Al_2O_3$. During the use of the cutting tool, and associated heating at the surface, the high toughness of the $\kappa\text{-}Al_2O_3$ layer and the relatively small loss in hardness at high temperatures bring about improved properties and improved durability compared to $\alpha\text{-}Al_2O_3$. Since the thermal conductivity is relatively low compared to $\alpha\text{-}Al_2O_3$, heat is transmitted only to a relatively small degree to the layers lying further inwards, and as a result undesirably intense heating of the cutting tool is avoided. The layers described each have a polycrystalline structure. The multilayer coating is formed in particular by means of thermally activated chemical vapour deposition (CVD). The multilayer coating can be applied at least in a surface region of the cutting tool which enters into engagement with a material to be machined during use of the cutting tool. It is preferable that the cutting tool can be formed by an indexable insert. It can be intended with preference for machining iron-based materials. According to one development, the layers described directly adjoin one another (without further layers formed therebetween). The individual layers specified can also themselves be formed with a number of layers and, for example, also have different stoichiometric ratios in the individual layers. The information provided in relation to the texturing in the context of the present description always refers to the Miller indices in the hld notation. In this case, the hld values are assigned in accordance with the notation of the JCPDS database (or JCPDF database) for the respective layers. The texture coefficient TC is calculated here by the following formula:

$$TC_{(hkl)} = \frac{I_{(hkl)} / I_{0,(hkl)}}{1/n \sum_n I_{(hkl)} / I_{0,(hkl)}}$$

where $I_{(hkl)}$ denotes the intensity which was measured in relation to the respective (hkl) value (from at least one corresponding peak), $I_{0,(hkl)}$ denotes the corresponding standardized intensity in accordance with the JCPDS (or JCPDF) database and n as an index runs over all the intensities expected in relation to the respective composition for (hkl) values.

According to one configuration, the at least one outer layer $\kappa\text{-}Al_2O_3$ has a mean stress of between −100 MPa (compressive stress) and 700 MPa (tensile stress). In this context, "mean stress" denotes a value which is averaged over the entire layer thickness in a direction perpendicular to the layer plane. In this context, it should be taken into consideration that along this direction in particular part of the layer can have a tensile stress and another part of the layer can have a compressive stress. In this case, the stress can be determined in particular by XRD (X-Ray Diffraction) measurements and the known $\sin^2\psi$ method (described for example in: I. C. Noyan, J. B. Cohen, Residual Stress Measurement by Diffraction and Interpretation, Springer-Verlag, New York, 1987 (pp 117-130)). Other stresses in layers, which are described hereinbelow, can also be determined by this method. It has been found that a mean stress in the specified range leads to particularly good durability of the cutting tool. The magnitude of the stress can be set, for example, by a pressurized-jet smoothing process, where, as various parameters in the pressurized-jet smoothing process, it is possible to vary the composition of the material used in the pressurized jet (e.g. ceramic abrasive bodies), the particle size distribution of the material, the jet pressure and also to a lesser extent the duration of treatment and the angle at which the jet is directed onto the surface.

According to one configuration, an outermost region of the at least one outer layer $\kappa\text{-}Al_2O_3$ has a mean compressive stress. This can be achieved with the treatment described above. It should be taken into consideration that this compressive stress can also be realized over the entire outer layer $\kappa\text{-}Al_2O_3$ in combination with a mean tensile stress by setting an appropriate pressure gradient over the layer thickness in the outer layer κ-Al$_2$O$_3$. Since the outer layer is formed from κ-Al$_2$O$_3$, such a pressure gradient can be set reliably.

According to a preferred configuration, the at least one layer TiC$_{x1}$N$_{y1}$ has a layer thickness of between 0.1 μm and 1 μm, the at least one layer TiC$_{x2}$N$_{y2}$O$_{z2}$ has a layer thickness of between 5 μm and 15 μm, the at least one layer which is formed from TiN or TiC$_{x31}$N$_{y31}$ or TiN$_{y32}$B$_{v32}$ has a layer thickness of between 0.1 μm and 3 μm, the at least one layer which is formed from TiN$_{y41}$B$_{v41}$O$_{z41}$ or TiC$_{x42}$N$_{y42}$O$_{z42}$ has a layer thickness of between 0.01 μm and 0.5 μm, and the at least one outer layer κ-Al$_2$O$_3$ has a layer thickness of between 2 μm and 10 μm. It has been found that the desired properties can be achieved particularly readily if the multilayer coating is formed with these thicknesses of the individual layers.

According to one embodiment, the at least one outer layer κ-Al$_2$O$_3$ has a grain size of less than 3 μm in a plane parallel to the layer surface. In the case of κ-Al$_2$O$_3$, this grain size can be set by the parameters of the CVD process. It has been found that a particularly durable coating having a smooth surface is achieved with this grain size.

According to one embodiment, the at least one layer TiC$_{x2}$N$_{y2}$O$_{z2}$ has a proportion z2>0. Such a finite proportion of oxygen in the layer can be achieved by systematic doping with oxygen during the CVD process via CO in the process gas. The value of z2 can be set, for example, by the flow rate of CO in the process gas. The gradual doping with oxygen in conjunction with the preferential texturing of the TiC$_{x2}$N$_{y2}$O$_{z2}$ layer and of the outer layer of κ-Al$_2$O$_3$, in particular, has the effect that the stress conditions in the layers can be set reliably and a good bond between the individual layers is ensured.

It is preferable that the hard metal body is formed from WC comprising 5.5-10% by weight Co and 5-9% by weight cubic carbides of at least one metal from groups IVb, Vb, VIb of the periodic system. In this respect, the at least one metal from groups IVb, Vb or VIb of the periodic system is preferably formed by Ti, Hf, Zr or a combination thereof. Particularly on a hard metal body formed in this way, the multilayer coating specified, on account of the appropriate physical and chemical properties, leads to a particularly resistant and durable cutting tool. It is preferable that the hard metal body has a marginal zone which has a thickness of between 5 μm and 30 μm, in particular of between 15 μm and 25 μm, and in which the proportion of Co is increased in relation to the interior of the hard metal body and the proportion of cubic carbides of at least one metal from groups IVb, Vb, VIb of the periodic system is reduced in relation to the interior of the hard metal body.

It has been found that the formation of the at least one outer layer as a single-layer coating κ-Al$_2$O$_3$ in particular leads to a particularly good result. In this context, "single-layer" is understood to mean in particular that at least predominantly one individual layer of crystallites is present, and a plurality of crystallites are not predominantly arranged one above another in the direction perpendicular to the layer plane. In an outer layer of this type, the pressure conditions can be set particularly reliably.

If the multilayer coating comprises at least one layer TiN having a layer thickness of up to 1 μm adjoining the hard metal body, a particularly good bond is achieved between the multilayer coating and the hard metal body.

According to a preferred configuration, the at least one layer TiC$_{x2}$N$_{y2}$O$_{z2}$ comprises plate-like, columnar crystals. Furthermore, the at least one layer which is formed by TiN or TiC$_{x31}$N$_{y31}$ or TiN$_{y32}$B$_{v32}$ preferably comprises fine-grained to lamellar dendritic crystals. Similarly, the at least one layer which is formed by TiN$_{y41}$B$_{v41}$O$_{z41}$ or TiC$_{x42}$N$_{y42}$O$_{z42}$ preferably comprises fine-grained to lamellar dendritic crystals. By way of these structures, good cohesion between the layers is achieved, as is the formation of the outer layer κ-Al$_2$O$_3$ with small grain sizes.

According to one configuration, the at least one outer layer κ-Al$_2$O$_3$ is mechanically smoothed, in particular blasted by pressurized-jet smoothing. This type of machining is reflected directly in the properties of the cutting tool which are created and can be identified by the remaining structure of the outer layer. The mechanical smoothing leads on the one hand to a smooth outer face of the outer layer, and on the other hand at the same time makes it possible to generate the desired stress conditions in the coating. By suitably adapting the parameters of a pressurized-jet smoothing process, both effects can be achieved in the desired manner. As various parameters of the pressurized-jet smoothing process, it is possible to vary inter alia the composition of the material used in the pressurized jet (e.g. ceramic abrasive bodies), the particle size distribution of the material, the jet pressure and also to a lesser extent the duration of treatment and the angle at which the jet is directed onto the surface.

According to a preferred development, the at least one outer layer κ-Al$_2$O$_3$ has a preferential texturing in the (110) direction with a texture coefficient TC$_{(110)}$≥1.3. In this respect, the outer layer preferably also has a preferential texturing in the (004) direction with a texture coefficient TC$_{(004)}$≥1.3 and a preferential texturing in the (015) direction with a texture coefficient TC$_{(015)}$≥1.3. In this case, the following preferably applies: TC$_{(110)}$>TC$_{(004)}$ and TC$_{(110)}$>TC$_{(015)}$. It has been found that the stress conditions in the coating can be set particularly well and a smooth surface is achieved in particular in the case of such a texturing of the outer layer in conjunction with the further layers.

According to a preferred configuration, 0.01≤z2≤0.02. In this case, the layer TiC$_{x2}$N$_{y2}$O$_{z2}$ therefore has an oxygen content z2 in the range of between 0.01 and 0.02. It has been found that particularly preferred properties of the cutting tool are achieved in particular with this oxygen content. In this respect, three effects in particular play a decisive role. With an increasing value for z2, the structure of the TiC$_{x2}$N$_{y2}$O$_{z2}$ layer is refined, such that a higher toughness of the layer results in accordance with the Hall-Petch effect. Furthermore, in the range 0.01≤z2≤0.02, a minimum of the remaining tensile stress in the TiC$_{2}$N$_{y2}$O$_{z2}$ layer after it has been formed is achieved. In addition, a particularly high penetration hardness of this layer is achieved in this range. These effects have a positive effect in particular on the wear resistance of the cutting tool.

According to one configuration, 0≤z2≤0.01 and 0.5≤x2≤0.75.

Further advantages and developments of the invention will become apparent from the following description of exemplary embodiments with reference to the figures.

DESCRIPTION OF THE INVENTION

Figure 1:
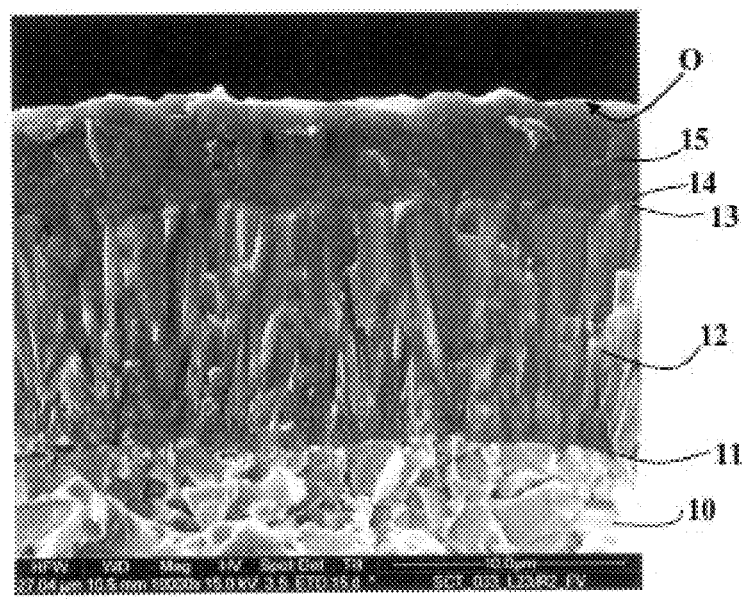
FIG. 1 shows a scanning electron microscope image of a broken surface of a multilayer coating on a hard metal body according to one embodiment.
Figure 4:
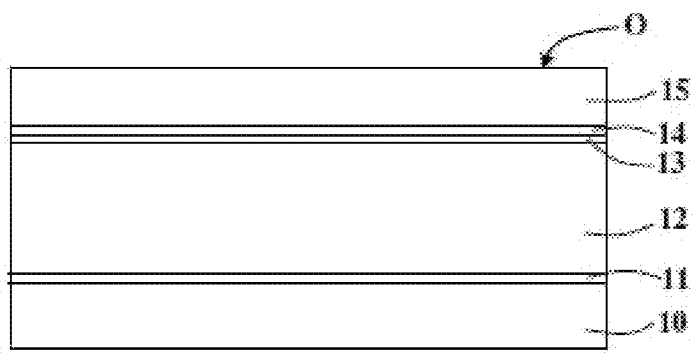
FIG. 4 is a schematic illustration (not to scale) showing the layer sequence in the cutting tool.
Figure 2:
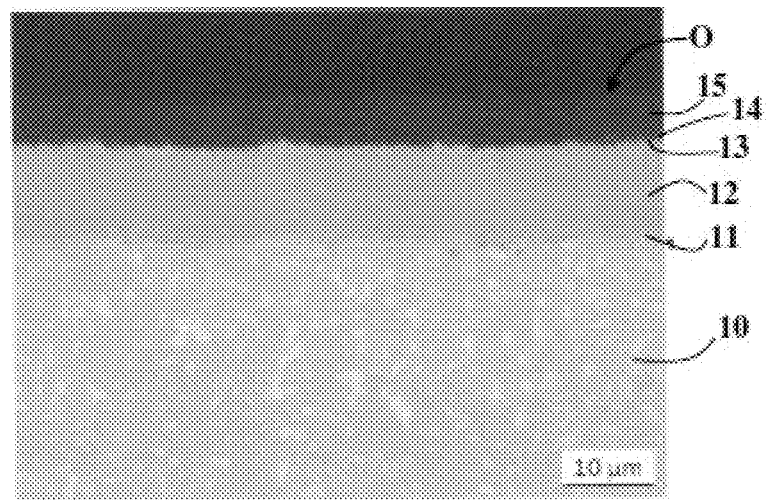
FIG. 2 shows an optical microscope image of a ground surface of the multilayer coating on the hard metal body.

One embodiment is described hereinbelow with reference to FIG. 1 to FIG. 4.

The cutting tool according to the embodiment described hereinbelow is an indexable insert for the cutting machining of metallic materials. In the exemplary embodiment, the cutting tool is an indexable insert for turning and for the cutting machining similar to turning of iron-based materials, e.g. steels, cast materials and stainless steels. The cutting tool is designed for fine, medium and coarse machining. The exemplary cutting tool is in particular a cutting insert for turning for the ISO P, M, K 15-35 range, in particular for the P15-P35 range. This area of use has a large load profile and comprises the widest variety of applications, e.g. dry and wet cutting with continuous (or smooth) or interrupted cutting operations on different iron-containing materials classes, e.g. alloyed steels, stainless steels or cast materials having the widest variety of alloying components.

The cutting tool comprises a hard metal body -10-, which is provided with at least one functional surface region, in particular a cutting edge and chip-guiding structures adjoining the latter. In the exemplary embodiment, the hard metal body is formed from WC comprising 5.5-10% by weight Co and 5-9% by weight cubic carbides of at least one metal from groups IVb, Vb, VIb of the periodic system. In the example described hereinbelow, the hard metal body comprises in particular $7\pm1\%$ by weight Co and $8.1\pm0.5\%$ by weight Ta(Nb)C having a grain size of between 1 µm and 2 µm (specification H718). In the example, the hard metal body -10- has a marginal zone (adjoining the multilayer coating described hereinbelow) which has a thickness of between 5 µm and 30 µm and in which the proportion of Co is increased (enriched) in relation to the interior of the hard metal body and the proportion of cubic carbides of at least one metal from groups IVb, Vb, VIb of the periodic system is reduced (depleted) in relation to the interior of the hard metal body.

At least one functional surface region of the hard metal body -10- is provided with a multilayer coating formed by a plurality of different layers. The different layers are all deposited on the surface of the hard metal body -10- in succession by means of CVD processes. The various layers are deposited using the precursors $TiCl_4$, $CH_3CN$, $CH_4$, $H_2$, $N_2$, CO, $CO_2$, HCl, $H_2S$ and $AlCl_3$, as will be described in more detail hereinbelow. In this respect, $AlCl_3$ can be produced and provided in particular via metallic Al and HCl. The layers are deposited in an LPCVD (low pressure chemical vapour deposition) process in a coating system of the type SuCoTec SCT600-TH, which was operated in accordance with its operating manual.

A layer -11- $TiC_{x1}N_{y1}$, where $x1+y1=1$, $x1\geq0$, $y1\geq0$, having a thickness of between 0.1 µm and 1 µm is formed directly on the surface of the hard metal body -10-. In the example shown in FIGS. 1 and 2, the layer -11- is formed by a layer TiN (i.e. $x1=0$) having a thickness of approximately 0.5 µm to 1 µm. The layer -11- serves as an intermediate layer in order to ensure a good bond between the hard metal body -10- and the following layer.

Figure 3:
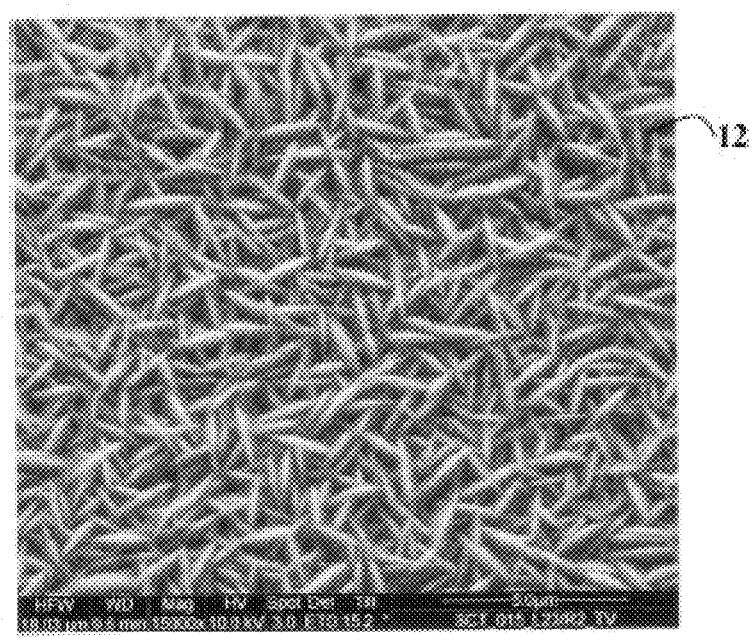
FIG. 3 shows a scanning electron microscope image of a surface of the TiC$_{x2}$N$_{y2}$O$_{z2}$ layer.

A layer -12- $TiC_{x2}N_{y2}O_{z2}$, where $x2+y2+z2=1$, $0<z2<0.03$ and $0.5<x2<0.85$, having a thickness of between 5 µm and 15 µm is deposited directly on the surface of the layer -11-. However, the layer can also have, for example, $0\leq z2\leq0.01$ and $0.5\leq x2\leq0.75$. It is preferable that $z2>0$. However, a range $0.01\leq z2\leq0.02$ is particularly preferred. In the example shown in FIGS. 1 to 3, the layer -12- has a thickness of approximately 10 µm. In the example shown in FIGS. 1 to 3, the layer -12- has, for example, a composition of approximately $TiC_{0.59}N_{0.41}$, with traces of O, preferably where $0.01\leq z2\leq0.02$. The layer -12- is produced by a moderate-temperature process from $TiCl_4$ and $CH_3CN$ as precursors with gradual doping by means of CO. The layer -12- comprises plate-like, columnar crystals, as can be seen in FIG. 3. It has been found that a flow rate of CO of between approximately 0.2 l/min and approximately 1 l/min in the moderate-temperature process has a particularly advantageous effect on the formation of the desired layer -12-. The layer -12- is formed in such a manner that it has a preferential texturing in the (311) direction with a texture coefficient $TC_{311}\geq1.3$. In this case, $TC_{311}$ is determined by the following formula:

$$TC_{(hkl)} = \frac{I_{(hkl)}/I_{0,(hkl)}}{1/n\sum_{n} I_{(hkl)}/I_{0,(hkl)}}$$

where $I_{(hkl)}$ denotes the intensity which was measured in relation to the respective (hkl) value (from at least one corresponding peak), $I_{0,(hkl)}$ denotes the corresponding standardized intensity in accordance with the JCPDS (or JCPDF) database and n as an index runs over all the intensities expected in relation to the respective composition for (hkl) values. It has been found that in particular the targeted admixture of CO in the process gas, which brings about gradual doping of the layer -12- with O, in combination with the preferential texturing in the (311) direction has the effect that the stress conditions throughout the multilayer coating can be set particularly well, and that the individual layers result in a particularly stable composite. In this case, a range $z2\leq0.03$ has proved to be preferable, in particular a range $0.01\leq z2\leq0.02$. In particular, the stress in the layer -12- can thereby be kept at a relatively low tensile stress level, particularly if $0.01\leq z2\leq0.02$. The resulting stress in the layer thus formed (as an individual layer) was determined by the $\sin^2\psi$ method, and is approximately $200\pm47$ MPa. The penetration hardness $H_{IT}$ 0.003/30/1/30 of the individual layer was determined to EN ISO 14577-1, and is approximately $29.1\pm1.3$ GPa.

At least one layer -13- which is formed from TiN or $TiC_{x31}N_{y31}$ or $TiN_{y32}B_{v32}$ is formed directly on the layer -12-. In this case, $0.2\leq x31\leq0.8$ and $x31+y31=1$ or $0.0001\leq v32\leq0.05$ and $y32+v32=1$. The layer -13- here has a layer thickness of between 0.1 µm and 3 µm. In the example shown in FIGS. 1 and 2, the layer has a mean layer thickness of approximately 0.5 µm. At least one layer -14- which is formed from $TiN_{y41}B_{41}O_{z41}$ or $TiC_{x42}N_{y42}O_{z42}$ is formed directly on the layer -13-. In this case, $y41+v41+z41=1$ and $0.0001\leq v41\leq0.05$ and $0.01\leq z41\leq0.3$ or $x42+y42+z42=1$ and $0\leq y42\leq0.5$ and $0.01\leq z42\leq0.3$. The layer -14- here has a layer thickness of between 0.01 µm and 0.5 µm. The layers -13- and -14- serve inter alia for providing a particularly good bond to the following outer layer -15- of $\kappa$-$Al_2O_3$. This bond is achieved in a particularly advantageous manner in particular by the layer sequence specified. The layers -13- and -14- are produced from the precursors $TiCl_4$, $N_2$, $CH_4$, $H_2$, $BCl_3$ and CO and also via various etching and flushing steps. It has been found to be particularly advantageous if no further carbon apart from CO is present in the process gas during the production of the layer -14-. The layers -13- and -14- each comprise fine-grained to lamellar dendritic crystals. The layer -14- in particular has a major influence on the outer layer -15- of κ-Al$_2$O$_3$ described hereinbelow, in particular on the grain size distribution thereof and on the orientation of the crystallites or the texture.

The outer layer -15- of κ-Al$_2$O$_3$ is formed directly on the layer -14-. The outer layer -15- of K-Al$_2$O$_3$ has a layer thickness of between 2 μm and 10 μm, preferably of between 3.5 μm and 6.5 μm. In the example shown in FIGS. 1 and 2, the outer layer -15- has a layer thickness of approximately 5 μm. The outer layer -15- of κ-Al$_2$O$_3$ has a mean grain size of less than 3 μm, preferably of between 1.3 μm and 1.8 μm, in a plane parallel to the layer surface. The mean grain size was determined in this case via the averaged square side length from the number of individuals (crystallites on the surface) per unit area, where a scanning electron microscope image of the surface of the outer layer -15- served as the basis. That is to say, the number of crystallites per unit area was determined, it being assumed that each of these has square bases. The mean grain size was then determined therefrom. The outer layer -15- of κ-Al$_2$O$_3$ is formed by a single-layer coating. It is possible to ensure that the κ-Al$_2$O$_3$ layer -15- is deposited from the precursors HCl, AlCl$_3$, CO$_2$, H$_2$S and H$_2$ via targeted chlorination and precise setting of the oxygen partial pressure. The outer layer -15- of κ-Al$_2$O$_3$ has preferential texturings in the (110) direction, in the (004) direction and in the (015) direction. For the texture coefficient for the (110) direction, $TC_{(110)} \geq 1.3$. For the texture coefficient for the (004) direction, $TC_{(004)} \geq 1.3$; and for the texture coefficient for the (015) direction, $TC_{(015)} \geq 1.3$. In particular, the texture coefficient for the (110) direction is in each case greater than the texture coefficients for the (004) direction and the (015) direction, i.e. $TC_{(110)} > TC_{(004)}$ and $TC_{(110)} > TC_{(015)}$. In the case of the exemplary outer layer -15- shown in FIGS. 1 and 2, the following were measured, for example: $TC_{(110)}=2.7$; $TC_{(004)}=1.85$ and $TC_{(015)}=1.73$. For determining the respective texture coefficients for the outer layer -15- and the layer -12-, in this case GA-XRD (X-Ray Diffraction) measurements were carried out in each case with Cu K$_\alpha$ radiation, and the texture coefficients were calculated using the formula already indicated above with reference to the JCPDS database (or JCPDF database). In the example shown, the outer layer -15- of κ-Al$_2$O$_3$ deposited in this way has a penetration hardness HIT 0.003/30/1/30, determined to EN ISO 14577-1, of 22.5±0.5 GPa.

The surface of the outer layer -15- of κ-Al$_2$O$_3$ was after-treated in a wet pressurized-jet process. This after-treatment significantly modifies the surface in terms of roughness and stresses in the upper layers of the multi-layer coating. In the wet pressurized-jet process, use was made of Al$_2$O$_3$ powder in an aqueous solution, with tests being carried out with grain size distributions having mesh values 500, 280/320 and 180/220. The best results were achieved with the mesh value 280/300 and with jet pressures of between approximately 3 bar and 4 bar with an angle of incidence onto the surface of between 35° and 45°. Surface roughnesses having values Ra<0.25 μm were achieved in this case in the functional surface region, where these values were determined by means of light interference processes.

The surface treatment described in this case had the effect that overall a mean stress of between −100 MPa (compressive stress) and 700 MPa (tensile stress) is formed in the outer layer -15-κ-Al$_2$O$_3$, and in this case an outermost edge region of the outer layer -15-κ-Al$_2$O$_3$, which is located at the surface, has a mean compressive stress. Compressive stresses which bring about good resistance of the surface were therefore advantageously achieved in this way in the outermost edge region of the outer layer -15-. At the same time, a stress gradient in the direction towards the underlying layers which leads to a particular stability and resistance of the multilayer coating (-11-, -12-, -13-,-14, -15-) was achieved in the outer layer -15-. These advantageous stress conditions can be attributed in particular to the relatively high plastic deformability of the outer layer -15-κ-Al$_2$O$_3$ in conjunction with the doping of the layer -12- with oxygen in combination with the surface treatment by the pressurized-jet process.

The thicknesses of the individual layers described were determined via an etched optical microscope microsection of the cutting insert and also via a calotte grinding process. In the example shown in FIGS. 1 and 2, the multilayer coating (-11-, -12-, -13-, -14-, -15-) has a mean overall thickness of approximately 15 μm.

The text which follows describes test examples which show that improved properties are achieved with the described cutting tool compared to known cutting tools. The table below specifies ten examples in total, which are described afterwards.

| Example no. | Insert type | Comparative cutting tool | Machined material | Feed per revolution [mm] | Cutting depth [mm] | Cutting speed [m/min] | Improvement achieved [%] |
|---|---|---|---|---|---|---|---|
| 1 | I | A | 1.7220 | 0.2 | 5 | var. | 23 |
| 2 | II | B | 1.7131 | 0.3 | 2 | 220 | 60 |
| 3 | III | C | 1.4923 | 1.25 | 2-10 | 43 | 16-33 |
| 4 | I | D | 1.6562 | 0.2 | 5 | var. | 11 |
| 5 | IV | E | 1.3505 | 0.4 | var. | 220 | 19 |
| 6 | V | F | 1.7225 | 0.4 | var. | 220 | 16 |
| 7 | VI | G | 0.6025 | 0.3 | 2 | 350 | 18 |
| 8 | VI | G | 0.6025 | 0.25 | 2 | 500 | 10 |
| 9 | VI | G | 0.7060 | 0.25 | 2 | 250 | 15 |
| 10 | VII | H | 1.7225 | 0.25 | 2.5 | 220 | 29 |

Regarding the insert types (column 2), reference is made hereinbelow to ISO Standard 1832, which defines the various types of inserts. Regarding the various machined materials (column 4), reference is made in each case to the material numbers. The column with the heading "Improvement achieved [%]" specifies the respective improvement which is achieved in the service life (or lifetime) of the cutting tool according to the invention compared with the comparative cutting tool.

EXAMPLE 1

In Example 1, the same material machining was effected in each case using the cutting tool according to the invention as described above and a known cutting tool A. Both cutting tools had a form (I) CNMG-432 in accordance with ISO 1832. The machined material was alloyed steel with the material number 1.7220. Material machining was effected with a feed of 0.2 mm per revolution, a cutting depth of 5 mm and at a varying cutting speed. A plurality of cuts were made. The multilayer coating of the cutting tool A comprised the following layers in the direction from a hard metal body to the surface: a TiN layer having a thickness of approximately 0.3 µm, a $TiC_xN_y$ layer having a thickness of approximately 6.3 µm, a $TiC_xN_yO_z$ layer having a thickness of approximately 0.2 µm, a $TiC_xN_yO_z$ layer having a thickness of approximately 0.4 µm, a $TiC_xN_yO_z$ layer having a thickness of approximately 0.6 µm and an outer layer of $\alpha$-$Al_2O_3$ having a thickness of approximately 5.5 µm.

With the cutting tool according to the invention, an improvement in the durability (or lifetime) of 23% was achieved over the cutting tool A.

EXAMPLE 2

In Example 2, the same material machining was effected in each case using the cutting tool according to the invention as described above and a known cutting tool B. Both cutting tools had a form (II) WNMG060408 in accordance with ISO 1832. The machined material was alloyed steel with the material number 1.7131. Material machining was effected with a feed of 0.3 mm per revolution, a cutting depth of 2 mm and at a cutting speed of 220 m/min. The multilayer coating of the cutting tool B had the same layer sequence as the cutting tool A described in Example 1.

With the cutting tool according to the invention, an improvement in the durability (or lifetime) of 60% was achieved over the cutting tool B.

EXAMPLE 3

In Example 3, the same material machining was effected in each case using the cutting tool according to the invention as described above and a known cutting tool C. Both cutting tools had a form (III) SNMM250732 in accordance with ISO 1832. The machined material was stainless steel with the material number 1.4923. Material machining was effected with a feed of 1.25 mm per revolution, a cutting depth of between 2 mm and 10 mm and at a cutting speed of 43 mm/min. The multilayer coating of the cutting tool C comprised the following layers in the direction from a hard metal body to the surface: a TiN layer having a thickness of approximately 0.3 µm, a $TiC_xN_y$ layer having a thickness of approximately 9 µm and an outer layer of $\alpha$-$Al_2O_3$ having a thickness of approximately 4 µm. A TiN layer having a thickness of approximately 3 µm had been applied to the outer layer.

With the cutting tool according to the invention, an improvement in the durability (or lifetime) of between 16% and 33% was achieved over the cutting tool C.

EXAMPLE 4

In Example 1, the same material machining was effected in each case using the cutting tool according to the invention as described above and a known cutting tool D. Both cutting tools had the form (I) CNMG-432 in accordance with ISO 1832. The machined material was alloyed steel with the material number 1.6562. Material machining was effected with a feed of 0.2 mm per revolution, a cutting depth of 5 mm and at a varying cutting speed. A plurality of cuts were made. The multilayer coating of the cutting tool D had the same structure as the cutting tool C described in Example 3.

With the cutting tool according to the invention, an improvement in the durability (or lifetime) of 11% was achieved over the cutting tool D.

EXAMPLE 5

In Example 5, the same material machining was effected in each case using the cutting tool according to the invention as described above, the surface treatment of which was carried out by the pressurized-jet process, and an identically formed cutting tool E, the surface treatment of which was not carried out by the pressurized-jet process. Both cutting tools had a form (IV) CNMG 120412 in accordance with ISO 1832. The machined material was 100Cr6 with the material number 1.3505. Material machining was effected with a feed of 0.4 mm per revolution, a varying cutting depth and at a cutting speed of 220 m/min. Wet cutting of segments was carried out.

With the cutting tool, the surface treatment of which was carried out by the pressurized-jet process, an improvement in the durability (or lifetime) of 19% was achieved.

EXAMPLE 6

In Example 6, the same material machining was effected in each case using the cutting tool according to the invention as described above, the surface treatment of which was carried out by the pressurized-jet process, and an identically formed cutting tool F, the surface treatment of which was not carried out by the pressurized-jet process. Both cutting tools had a form (V) CNMG 120812 in accordance with ISO 1832. The machined material was 42CrMo4 with the material number 1.7225. Material machining was effected with a feed of 0.4 mm per revolution, a varying cutting depth and at a cutting speed of 220 m/min. Wet cutting of segments was carried out.

With the cutting tool, the surface treatment of which was carried out by the pressurized-jet process, an improvement in the durability (or lifetime) of 16% was achieved.

EXAMPLE 7

In Example 7, the same material machining was effected in each case using the cutting tool according to the invention as described above and a cutting tool G. Both cutting tools had a form (VI) CNMA 120408 in accordance with ISO 1832. The machined material was GG25 with the material number 0.6025. Material machining was effected with a feed of 0.3 mm per revolution, a cutting depth of 2 mm and at a cutting speed of 350 m/min. Dry longitudinal turning was carried out. The multilayer coating of the cutting tool G comprised the following layers in the direction from a hard metal body to the surface: a TiN layer having a thickness of approximately 0.3 µm, a $TiC_xN_y$ layer having a thickness of approximately 5.5 µm, a $TiC_xN_yO_z$ layer having a thickness of approximately 0.7 µm and an outer layer of $\alpha$-$Al_2O_3$ having a thickness of approximately 4.5 to 5 µm. Furthermore, a layer of $TiC_xN_y$ having a thickness of approximately 1 µm had been formed on the outer layer.

With the cutting tool according to the invention, an improvement in the durability (or lifetime) of 18% was achieved over the cutting tool G.

EXAMPLE 8

In Example 8, the same material machining was effected in each case using the cutting tool according to the invention as described above and the cutting tool G described in Example 7. The machined material corresponds to Example 7. Material machining was effected with a feed of 0.25 mm per revolution, a cutting depth of 2 mm and at a cutting speed of 500 m/min. Wet longitudinal turning was carried out.

With the cutting tool according to the invention, an improvement in the durability (or lifetime) of 10% was achieved over the cutting tool G.

EXAMPLE 9

In Example 9, the same material machining was effected in each case using the cutting tool according to the invention as described above and the cutting tool G described in Example 7. The machined material was GGG60 with the material number 0.7060. Material machining was effected with a feed of 0.25 mm per revolution, a cutting depth of 2 mm and at a cutting speed of 250 m/min. Longitudinal turning was carried out.

With the cutting tool according to the invention, an improvement in the durability (or lifetime) of 15% was achieved over the cutting tool G.

EXAMPLE 10

In Example 10, the same material machining was effected in each case using the cutting tool according to the invention as described above and a cutting tool H. Both cutting tools had a form (VII) CNMG 120408 in accordance with ISO 1832. The machined material was alloyed steel with the material number 1.7225. Material machining was effected with a feed of 0.25 mm per revolution, a cutting depth of 2.5 mm and at a cutting speed of 220 m/min. Longitudinal turning was carried out. The multilayer coating of the cutting tool H comprised the following layers in the direction from a hard metal body to the surface: a TiN layer having a thickness of approximately 0.3 µm, a $TiC_xN_y$ layer having a thickness of approximately 3-4 µm, a $TiC_xN_y$ layer (with different values of x and y) having a thickness of approximately 2.5 µm, a $TiN_yB_v$ layer having a thickness of approximately 0.4 µm and an outer layer of $\kappa\text{-}Al_2O_3$ having a thickness of approximately 2 µm. Furthermore, a TiN layer having a thickness of approximately 0.2-0.3 µm had been formed on the outer layer.

With the cutting tool according to the invention, an improvement in the durability (or lifetime) of 29% was achieved.

The invention claimed is:

1. A cutting tool for machining metallic materials, comprising:
    a hard metal body and a multilayer coating applied to said hard metal body in at least one surface region thereof;
    said multilayer coating comprising the following layers in a direction from said hard metal body to a surface of the cutting tool:
    at least one layer $TiC_{x1}N_{y1}$, where $x1+y1=1$, $x1 \geq 0$, $y1 > 0$;
    at least one layer $TiC_{x2}N_{y2}O_{z2}$, where $x2+y2+z2=1$, $0 \leq z2 \leq 0.03$ and $0.5 \leq x2 \leq 0.85$, said at least one layer $TiC_{x2}N_{y2}O_{z2}$ having a texturing in a (311) direction with a texture coefficient $TC_{(311)} \geq 1.3$ and comprising plate-like, columnar crystals, wherein $0.01 \leq z2 \leq 0.02$;
    at least one layer: TiN, or $TiC_{x31}N_{y31}$, where $0.2 \leq x31 \leq 0.8$ and $x31+y31=1$, or $TiN_{y32}B_{v32}$, where $0.0001 \leq v32 \leq 0.05$ and $y32+v32=1$;
    at least one layer: $TiN_{y41}B_{v41}O_{z41}$, where $y41+v41+z41=1$ and $0.0001 \leq v41 \leq 0.05$ and $0.01 \leq z41 \leq 0.6$, or $TiC_{x42}N_{y42}O_{z42}$, where $x42+y42+z42=1$ and $0 \leq y42 \leq 0.5$ and $0.01 \leq z42 \leq 0.6$; and
    at least one outer layer $\kappa\text{-}Al_2O_3$.

2. The cutting tool according to claim 1, wherein said at least one outer layer $\kappa\text{-}Al_2O_3$ has a mean stress of between −100 MPa (compressive stress) and 700 MPa (tensile stress).

3. The cutting tool according to claim 1, wherein:
    said at least one layer $TiC_{x1}N_{y1}$ has a layer thickness between 0.1 µm and 1 µm,
    said at least one layer $TiC_{x2}N_{y2}O_{z2}$ has a layer thickness between 5 µm and 15 µm,
    said at least one layer TiN or $TiC_{x31}N_{y31}$ or $TiN_{y32}B_{v32}$ has a layer thickness between 0.1 µm and 3 µm,
    said at least one layer $TiN_{y41}B_{v41}O_{z41}$ or $TiC_{x42}N_{y42}O_{z42}$ has a layer thickness between 0.01 µm and 0.5 µm, and
    said at least one outer layer $\kappa\text{-}Al_2O_3$ has a layer thickness between 2 µm and 10 µm.

4. The cutting tool according to claim 1, wherein said at least one outer layer $\kappa\text{-}Al_2O_3$ has a grain size of less than 3 µm in a plane parallel to the layer surface.

5. The cutting tool according to claim 1, wherein said hard metal body consists of WC comprising 5.5-10% by weight Co and 5-9% by weight cubic carbides of at least one metal selected from groups IVb, Vb, VIb of the periodic table of elements.

6. The cutting tool according to claim 5, wherein said hard metal body has a marginal zone with a thickness of between 5 µm and 30 µm and wherein a proportion of Co is increased in relation to an interior of the hard metal body and a proportion of the cubic carbides of the at least one metal selected from the groups IVb, Vb, VIb of the periodic table of elements is reduced in relation to the interior of the hard metal body.

7. The cutting tool according to claim 1, wherein said at least one outer layer is a single-layer coating of $\kappa\text{-}Al_2O_3$.

8. The cutting tool according to claim 1, wherein said multilayer coating comprises at least one layer of TiN having a layer thickness of up to 1 µm adjoining the hard metal body.

9. The cutting tool according to claim 1, wherein said at least one layer TiN or $TiC_{x31}N_{y31}$ or $TiN_{y32}B_{v32}$ comprises fine-grained to lamellar dendritic crystals.

10. The cutting tool according to claim 1, wherein said at least one layer $TiN_{y41}B_{v41}O_{z41}$ or $TiC_{x42}N_{y42}O_{z42}$ comprises fine-grained to lamellar dendritic crystals.

11. The cutting tool according to claim 1, wherein said at least one outer layer $\kappa\text{-}Al_2O_3$ is a mechanically smoothed layer.

12. The cutting tool according to claim 11, wherein said at least one outer layer $\kappa\text{-}Al_2O_3$ has the characteristics of a layer having been blasted by pressurized-jet smoothing.

13. The cutting tool according to claim 1, wherein said at least one outer layer $\kappa\text{-}Al_2O_3$ has a preferential texturing in the (110) direction with a texture coefficient $TC_{(110)} \geq 1.3$.

14. The cutting tool according to claim 1, wherein $0.5 \leq x2 \leq 0.75$.

* * * * *